United States Patent
Kumakura et al.

(10) Patent No.: US 7,749,939 B2
(45) Date of Patent: Jul. 6, 2010

(54) MGB2 SUPERCONDUCTOR, ITS WIRE, AND A MANUFACTURING METHOD THEREOF

(75) Inventors: Hiroaki Kumakura, Ibaraki (JP); Hitoshi Kitaguchi, Ibaraki (JP); Masazumi Hirakawa, Aichi (JP); Hideyuki Yamada, Aichi (JP)

(73) Assignees: National Institute for Materials Science, Ibaraki (JP); Central Japan Railway Company, Aichi (JP)

( * ) Notice: Subject to any disclaimer, the term of this patent is extended or adjusted under 35 U.S.C. 154(b) by 803 days.

(21) Appl. No.: 11/509,634

(22) Filed: Aug. 25, 2006

(65) Prior Publication Data

US 2007/0054810 A1  Mar. 8, 2007

(30) Foreign Application Priority Data

Aug. 25, 2005  (JP) ............... 2005-244651

(51) Int. Cl.
*H01B 12/00* (2006.01)
*H01L 39/00* (2006.01)
*B32B 9/04* (2006.01)
*C01B 35/04* (2006.01)
*C01B 35/02* (2006.01)

(52) U.S. Cl. ............... 505/430; 505/431; 505/230; 505/231; 505/433; 505/490; 29/599; 174/125.1

(58) Field of Classification Search ............... 505/230, 505/430, 433, 434, 470, 490; 29/599; 174/125.1; 423/289
See application file for complete search history.

(56) References Cited

U.S. PATENT DOCUMENTS

2002/0173428 A1* 11/2002 Thieme et al. ............ 505/100
2006/0165579 A1* 7/2006 Jones et al. ................ 423/289

OTHER PUBLICATIONS

H. Fujii et al., "Enhancement of critical current densities of powder-in-tube processed $MgB_2$ tapes by using $MgH_2$ as a precursor powder", Superconductor Science and Technology, 15, pp. 1571-1576, 2002.
H. Kumakura et al., "Upper critical fields of powder-in-tube-processed $MgB_2$/Fe tape conductors", Applied Physics Letters, vol. 84, No. 18, pp. 3669-3671, May 3, 2004.

* cited by examiner

*Primary Examiner*—Stanley Silverman
*Assistant Examiner*—Kallambella Vijayakumar
(74) *Attorney, Agent, or Firm*—Wenderoth, Lind & Ponack, L.L.P.

(57) ABSTRACT

By adding an aromatic hydrocarbon such as benzene to the powder mixture of magnesium (Mg) or magnesium hydride ($MgH_2$) and boron (B) as raw materials of a superconductor $MgB_2$, high superconducting critical current density (Jc) is obtained.

12 Claims, 3 Drawing Sheets

MGB2 SUPERCONDUCTOR, ITS WIRE, AND A MANUFACTURING METHOD THEREOF

TECHNICAL FIELD

The present invention relates to a manufacturing method of a $MgB_2$ superconductor having a high critical current density ($J_c$) and its wire, and a $MgB_2$ superconductor and superconducting wire having a high critical current density ($J_c$) which are obtained from the method. Compared with a conventional metal-based superconductor in bulk form and its wire, it can be expected that the $MgB_2$ superconductor in bulk form and its wire can be used at higher temperature and lower the cost. Therefore, they can be applied to apparatuses such as a superconducting linear motor car, an MRI medical diagnosis apparatus, a single crystal synthesizing apparatus for semiconductors, superconducting energy storage, a superconducting rotating machine, a superconducting transformer, and a superconducting cable.

BACKGROUND ART

Because the superconductor $MgB_2$, which was discovered in Japan in 2001, has the most superior superconducting critical temperature (39 K) among the metal-based superconductors, and it is relatively easy to manufacture the bulk materials and to process the wire, research and development of this superconductor and of forming its wire is undertaken all over the world. A method of manufacturing the bulk materials generally includes pressurizing a mixed powder of Mg powder or $MgH_2$ powder and B powder and then heat-treating (sintering). One of the major methods of forming the wire is a powder-in-tube method wherein a metal tube is filled with Mg ($MgH_2$) powder and B powder. However, $J_c$ characteristics of the bulk form and the wire which are manufactured by the ordinary powder-sintering method and by the powder-in-tube method are not very high. Accordingly, in order to improve the $J_c$, there have been attempts to add various types of impurities into the mixed powder. Among these additions of impurities, the addition of SiC fine particles having a particle size at the nanometer level is most effective, and much research on this addition is being undertaken (S. X. Dou, et al., Journal of Applied Physics 94 (2003) 1850 (Document 1). However, the price of the SiC fine particles is high and has been an obstacle to putting this technique into practical use.

SUMMARY OF THE INVENTION

In view of the circumstance, the present invention has an object to provide a novel method with which $MgB_2$ superconductor and superconducting wire having a sufficiently high $J_c$ of practical level can be provided by a relatively simple method which solves the conventional problems and leads to lowering of costs.

As a means to solve the above-described problems, the present invention provides a method of manufacturing a $MgB_2$ superconductor or a $MgB_2$ superconducting wire, wherein an aromatic hydrocarbon such as benzene is added to the mixed powder of Mg powder or $MgH_2$ powder and B powder which are the raw materials of the superconductor $MgB_2$. The present invention provides a method of manufacturing a $MgB_2$ superconductor, wherein the aromatic hydrocarbon is a compound having a monocyclic or polycyclic carbocyclic ring or heterocyclic ring, the aromatic hydrocarbon is a compound having 4 to 20 carbon atoms, the aromatic hydrocarbon is one or more kinds of benzene, naphthalene, anthracene, perylene, biphenyl, and thiophene, and the aromatic hydrocarbon is added at the ratio of 1 to 40 mol % to $MgB_2$.

Moreover, the present invention provides a method of manufacturing a $MgB_2$ superconducting wire comprising filling and processing a metal tube with a mixture to which an aromatic hydrocarbon is added, and heat-treating the metal tube, wherein the metal tube is an iron tube, and the wire is a multifilament wire having a plurality of $MgB_2$ cores. As a method of mixing powders, ball-mill mixing and mixing in an ordinary mortar are considered, and the heat treatment is considered to be performed in an inert gas atmosphere such as argon or in a vacuum. Moreover, the metal tube is most appropriately an iron tube because it does not react with Mg or B and the price is low.

Furthermore, the present invention provides a $MgB_2$ superconductor or a $MgB_2$ superconducting wire manufactured with any of the methods, wherein $J_c$ in a magnetic field of 10 T at 4.2 K is 5000 $A/cm^2$ or more and $J_c$ in a magnetic field of 12 T at 4.2 K is 2000 $A/cm^2$ or more.

EMBODIMENT

Figure 1:
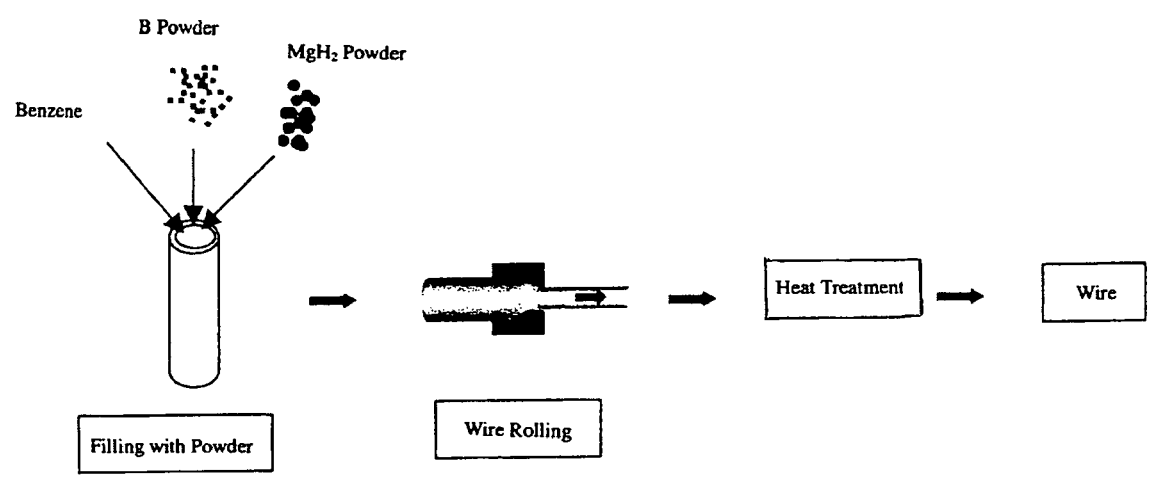
FIG. 1 is a flow chart of the manufacturing process of a $MgB_2$ superconducting wire according to the present invention.

The present invention has the characteristics as described above, and the embodiment is explained below in detail.

According to the present invention, the method of manufacturing a $MgB_2$ superconductor or its wire, as described previously, comprises adding an aromatic hydrocarbon, pressure-compacting, and heat-treating when a mixture of Mg powder or $MgH_2$ powder and B powder as raw materials of a $MgB_2$ superconductor is prepared.

The pressure-compacting is performed with a press using a metal mold and the pressure is preferably 100 to 300 $kg/cm^2$.

For the above-described powder as raw materials, powder having the same purity and particle size as the conventional method can be mixed in the range of Mg or $MgH_2/B = 0.5/2$ to $1.5/2$ molar ratio. More preferably, the molar ratio is in the range of about 0.8/2 to 1.2/2.

For the particle size, an average particle size of Mg or $MgH_2$ and B is considered to be preferably about in the range of 10 to 50 μm and 0.2 to 1 μm respectively. For the mixing, specifically, a proper amount of the aromatic hydrocarbon is added to the mixture of Mg powder or $MgH_2$ powder and B powder, and the mixture is mixed thoroughly using a ball mill or other means. After the mixture is pressure-compacted, it is heat-treated and the bulk form is obtained. In the case of the wire, a metal tube such as an iron tube is filled with the mixture to which the aromatic hydrocarbon is added, is processed to a tape or a wire with a pressure roll or other means, and is heat-treated.

The aromatic hydrocarbon may be considered to be various types of compound having a monocyclic or polycyclic carbocyclic ring or heterocyclic ring. Although the number of carbon atoms in the compound is not limited, it is considered to be suitably in the range of 4 to 20 in general.

The aromatic hydrocarbon may have various types of functional groups as long as the operation and effect of the invention are not inhibited. Considering the availability, handling, price, etc., the selection of the aromatic hydrocarbon can be made properly. Representative examples include carbocyclic aromatic hydrocarbons such as benzene, naphthalene, anthracene, perylene, biphenyl, toluene, and xylene, and heterocyclic aromatic hydrocarbons such as thiophene.

It is more preferable to add these aromatic hydrocarbons at a ratio of 1 to 40 mol % to $MgB_2$ in theory or in an experimental production amount. In this range, for example, the $MgB_2$ superconductor or its wire which has a high Jc at 4.2 K of 5000 A/cm$^2$ or more in a magnetic field of 10 T (tesla) and 2000 A/cm$^2$ or more in a magnetic field of 12 T (tesla), is realized more reliably.

For the mixing, pressure-compacting, and heat treatment, the same conditions as the conventional conditions may be adopted. The same applies to the conditions of forming a wire.

Accordingly, Examples are shown below and the invention is explained in more detail. Of course, the invention is not limited to Examples below.

EXAMPLES

Example 1

Figure 2:
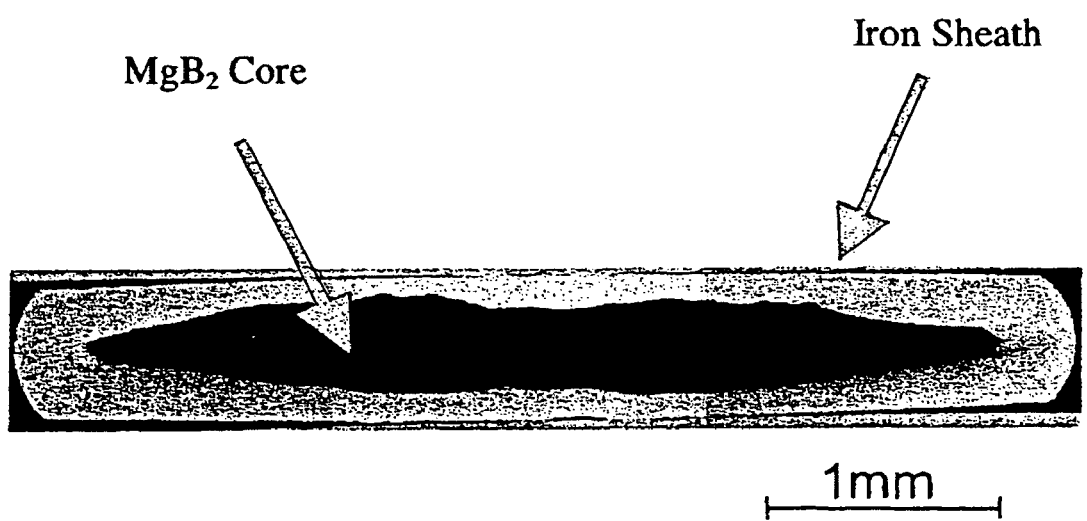
FIG. 2 is a cross-sectional view of the $MgB_2$ superconducting wire manufactured in Example.
Figure 3:
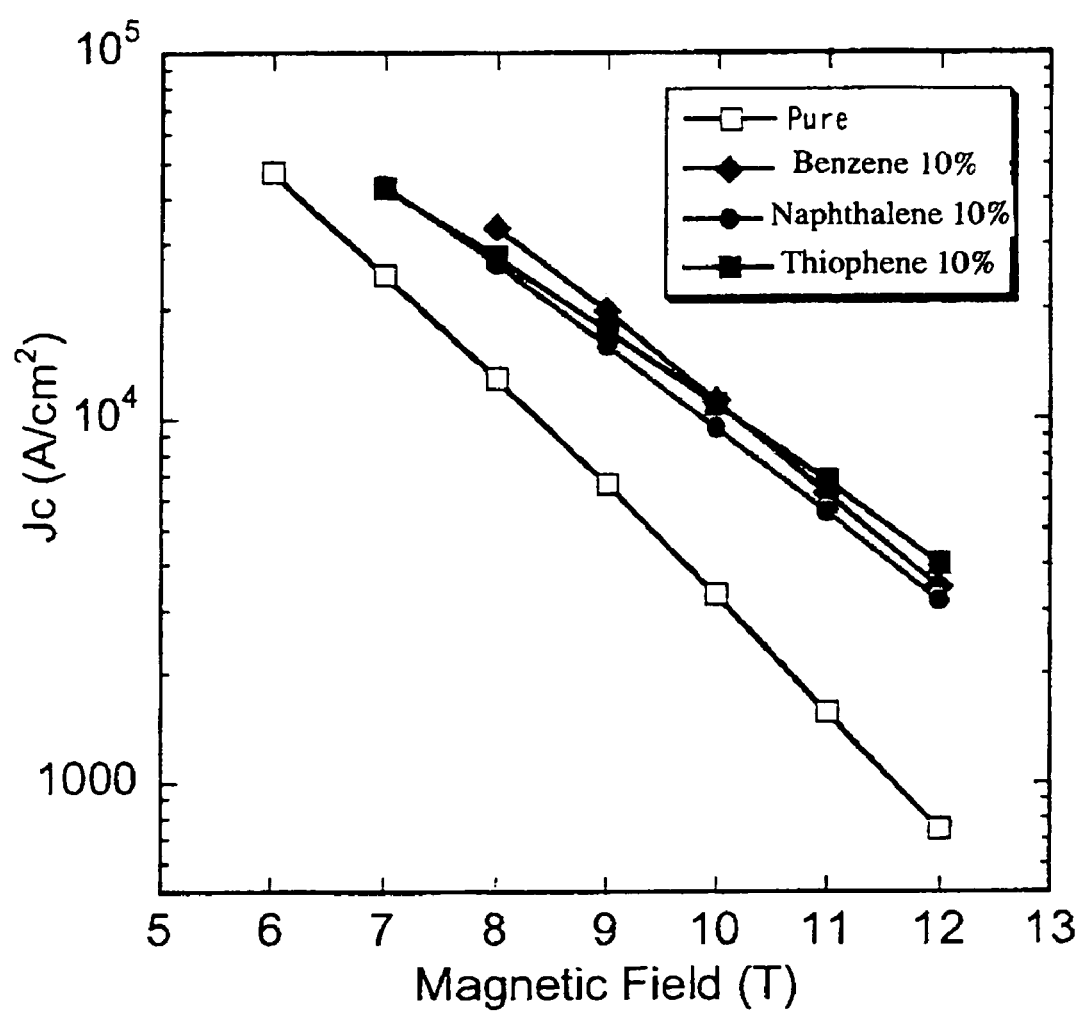
FIG. 3 is a diagram showing the relationship between critical current density ($J_c$) and magnetic field (B) at 4.2 K of the $MgB_2$ wire manufactured in Example.

$MgH_2$ powder available on the market and B powder available on the market were mixed at a molar ratio of 1:2. Then 10 mol % of benzene to $MgB_2$ was added, and the mixture was placed in a ball-mill pot manufactured by WC and subjected to ball milling for about an hour. An iron tube of 6 mm outer diameter and 4 mm inner diameter was filled with the mixed powder obtained in this manner, and processed into a tape of 5 mm width and 0.5 mm thickness by being processed with a groove roll and rolled with a flat roll. Moreover, a tape to which benzene was not added was manufactured with the same method for comparison. A heat treatment was performed on these wires for an hour at 600° C. in an argon atmosphere using a tube-like furnace. A flow chart of manufacturing the wire is shown in FIG. 1, and a cross-sectional photograph of the manufactured wire is shown in FIG. 2. The critical current density $J_c$ of these wires were measured in different magnetic fields at liquid helium temperature. The result is shown in FIG. 3. At 4.2 K, the critical current density of the tape to which benzene was added is 3400 A/cm$^2$ in a magnetic field of 12 T and 11000 A/cm$^2$ in a magnetic field of 10 T. A much higher $J_c$ value was obtained compared to that of the tape to which benzene was not added. After the heat treatment, the tapes were analyzed by x-ray diffraction. Although there was no change in the length of the c-axis of the diffraction pattern of the produced $MgB_2$, the length of the a-axis clearly became shorter with benzene added. This result is the same as the result of the already-reported $MgB_2$ to which SiC fine particles were added (Document 1).

According to Document 1, a part of the B atoms in $MgB_2$ was substituted by C atoms when SiC was added, $MgB_{2-x}C_x$ was produced, and as a result of this, the $J_c$ characteristics were improved. Considering this report, the reason why the $J_c$ characteristics were improved in the present experiment is presumed to be that a part of the B atoms in $MgB_2$ was substituted by a carbon atom when benzene was added, and $MgB_{2-x}C_x$ was produced.

Example 2

In place of benzene in Example 1, 10 mol % of naphthalene was added and a tape was manufactured with the same method. The $J_c$-B characteristics of the tape at 4.2 K are shown in FIG. 3. The critical current density was 3200 A/cm$^2$ in a magnetic field of 12 T and 9500 A/cm$^2$ in a magnetic field of 10 T. $J_c$ characteristics were obtained that are almost same as those of the tape to which benzene was added.

Example 3

In place of benzene in Example 1, 10 mol % of thiophene was added and a tape was manufactured with the same method. The $J_c$-B characteristics of the tape at 4.2 K are shown in FIG. 3. The critical current density was 4000 A/cm$^2$ in a magnetic field of 12 T and 11000 A/cm$^2$ in a magnetic field of 10 T. $J_c$ characteristics were obtained that are almost same as that of the tape to which benzene was added.

Example 4

In place of $MgH_2$ powder in Example 1, Mg powder available on the market was used. The molar ratio of Mg to B was set to be 1:2 and a $MgB_2$ superconducting tape was manufactured with the same method. The $J_c$-B characteristics of the tape at 4.2 K were measured, and almost the same $J_c$-B characteristics were obtained as those of the tape for which $MgH_2$ was used. The effect of adding benzene was also observed clearly in the case of using Mg powder in place of $MgH_2$ powder.

According to the present invention described above, a $MgB_2$ superconductor having higher superconducting critical current density ($J_c$) or its wire can be provided with a simple and lower cost method for practical use.

What is claimed is:

1. A method of manufacturing a $MgB_2$ superconductor comprising pressure-compacting and heat-treating a mixture of Mg powder or $MgH_2$ powder and B powder as raw materials, wherein an aromatic hydrocarbon is added to the mixture.

2. The method of manufacturing a $MgB_2$ superconductor according to claim 1, wherein the aromatic hydrocarbon is a compound having a monocyclic or polycyclic carbocyclic ring or heterocyclic ring.

3. The method of manufacturing a $MgB_2$ superconductor according to claim 2, wherein the aromatic hydrocarbon is a compound having 4 to 20 carbon atoms.

4. The method of manufacturing a $MgB_2$ superconductor according to claim 3, wherein the aromatic hydrocarbon is one or more kinds of benzene, naphthalene, anthracene, perylene, biphenyl, and thiophene.

5. The method of manufacturing a $MgB_2$ superconductor according to claim 1, wherein the aromatic hydrocarbon is added at the ratio of 1 to 40 mol % to $MgB_2$.

6. A method of manufacturing a $MgB_2$ superconducting wire comprising filling a metal tube with the mixture to which the aromatic hydrocarbon is added, and heat-treating the metal tube, in the method according to claim 1.

7. The method of manufacturing a $MgB_2$ superconducting wire according to claim 6, wherein the metal tube is an iron tube.

8. A method of manufacturing a $MgB_2$ superconducting wire according to claim 6, wherein the wire is a multifilament wire having a plurality of $MgB_2$ cores.

9. A method of manufacturing a $MgB_2$ superconducting wire comprising filling a metal tube with the mixture to which the aromatic hydrocarbon is added, and heat-treating the metal tube, in the method according to claim 2.

10. A method of manufacturing a $MgB_2$ superconducting wire comprising filling a metal tube with the mixture to which the aromatic hydrocarbon is added, and heat-treating the metal tube, in the method according to claim 3.

11. A method of manufacturing a MgB$_2$ superconducting wire comprising filling a metal tube with the mixture to which the aromatic hydrocarbon is added, and heat-treating the metal tube, in the method according to claim 4.

12. A method of manufacturing a MgB$_2$ superconducting wire comprising filling a metal tube with the mixture to which the aromatic hydrocarbon is added, and heat-treating the metal tube, in the method according to claim 5.

* * * * *